(12) United States Patent
Kovac

(10) Patent No.: US 10,581,409 B2
(45) Date of Patent: Mar. 3, 2020

(54) CLOCKED FREQUENCY DETECTOR RF AUTO-TUNING SYSTEM

(71) Applicant: pSemi Corporation, San Diego, CA (US)

(72) Inventor: David Kovac, Arlington Heights, IL (US)

(73) Assignee: pSemi Corporation, San Diego, CA (US)

(*) Notice: Subject to any disclaimer, the term of this patent is extended or adjusted under 35 U.S.C. 154(b) by 20 days.

(21) Appl. No.: 15/855,943

(22) Filed: Dec. 27, 2017

(65) Prior Publication Data

US 2019/0199328 A1 Jun. 27, 2019

(51) Int. Cl.
| | |
|---|---|
| *H03J 7/06* | (2006.01) |
| *H03J 3/12* | (2006.01) |
| *H03J 1/06* | (2006.01) |
| *H03J 3/18* | (2006.01) |

(52) U.S. Cl.
CPC ............... *H03J 7/06* (2013.01); *H03J 1/066* (2013.01); *H03J 3/12* (2013.01); *H03J 3/18* (2013.01)

(58) Field of Classification Search
CPC ...... H03J 7/06; H03J 1/066; H03J 3/12; H03J 3/18
USPC .......................................................... 334/87
See application file for complete search history.

(56) References Cited

U.S. PATENT DOCUMENTS

| | | | |
|---|---|---|---|
| 7,248,120 B2 | 7/2007 | Burgener et al. | |
| 7,795,968 B1 | 9/2010 | Li et al. | |
| 8,487,706 B2 | 7/2013 | Li et al. | |
| 9,024,700 B2 | 5/2015 | Ranta | |
| 9,197,194 B2 | 11/2015 | Reedy et al. | |
| 9,276,526 B2 | 3/2016 | Nobbe et al. | |
| 9,294,056 B2 | 3/2016 | Nobbe et al. | |
| 9,595,923 B2 | 3/2017 | Nobbe et al. | |
| 9,602,063 B2 | 3/2017 | Kaatz et al. | |
| 9,647,631 B2 | 5/2017 | Gaynor | |
| 9,712,120 B2 | 7/2017 | Nobbe et al. | |
| 2015/0236748 A1 | 8/2015 | Nobbe | |
| 2015/0236798 A1 | 8/2015 | Nobbe | |
| 2015/0249479 A1 | 9/2015 | Nobbe | |
| 2018/0172764 A1* | 6/2018 | Cross | G01R 31/31724 |

OTHER PUBLICATIONS

Omori et al., "Integrated RF Tunable Filter Based on Recursive Architecture and its Application", Proceedings of the 8th European Microwave Integrated Circuits Conference, Oct. 6-8, 2013, Nuremberg, Germany, pp. 548-551. (Year: 2013).*

(Continued)

*Primary Examiner* — Benny T Lee
*Assistant Examiner* — Hafizur Rahman
(74) *Attorney, Agent, or Firm* — Jaquez Land Greenhaus LLP; Alessandro Steinfl, Esq.

(57) ABSTRACT

Devices and methods for auto-tuning a tunable circuit based on a frequency of operation of the tunable circuit using a clocked frequency detector circuit are described. The clocked frequency detector uses a readily available clock signal to drive a counter circuit to provide an indication of the frequency of operation of the tunable circuit. The tunable circuit, including the clocked frequency detector, can be integrated within a same chip that is autonomously configurable based on the frequency of operation and the readily available clock.

22 Claims, 11 Drawing Sheets

(56) References Cited

OTHER PUBLICATIONS

Cordio-C50 radio IP Overview, © Arm Ltd. May 2018, https://www.arm.com/products/silicon-ip-wireless/wpan-complete-radio-ip-solutions, on p. 1, ARM Limited, 110 Fulbourn RoadCambridge, UK (Year: 2018).*
Vidmar, M., "A simple RF/Microwave frequency counter", VHF Communications Mar. 2007, pp. 130-140 (Year: 2007).*
LTC5507 data sheet, 100kHz to 1GHz RF Power Detector, Linear Technology Corporation, 1630 McCarthy Blvd.,Milpitas, CA 95035-7417, 2001, p. 1. (Year: 2001).*
AN 200, Electronic Counter Series, Fundamentals of the Electronic Counters, Hewlett-Packard Company. Copyright © 1997. (Year: 1997).*
Kovac, David, "Clockless Frequency Detector", U.S. Patent Application filed May 26, 2017, U.S. Appl. No. 15/607,374, 30 pgs.

* cited by examiner

CLOCKED FREQUENCY DETECTOR RF AUTO-TUNING SYSTEM

CROSS-REFERENCE TO RELATED APPLICATIONS

Cross-Reference to Related Tunable Circuits Applications:

The present application may be related to U.S. patent application Ser. No. 15/607,374, entitled "Clockless Frequency Detector", filed on May 26, 2017, the disclosure of which is incorporated herein by reference in its entirety. The present application may also be related to U.S. Pat. No. 9,595,923, entitled "Systems and Methods for Optimizing Amplifier Operations", issued Mar. 14, 2017, the disclosure of which is incorporated herein by reference in its entirety. The present application may also be related to U.S. patent application Ser. No. 14/794,699, entitled "Systems and Methods for Optimizing Amplifier Operations", filed on Jul. 8, 2015, now U.S. Pat. No. 9,712,120 issued Jul. 18, 2017, the disclosure of which is incorporated herein by reference in its entirety. The present application may also be related to U.S. Pat. No. 9,294,056 entitled "Scalable Periphery Tunable Matching Power Amplifier", issued Mar. 22, 2016, the disclosure of which is incorporated herein by reference in its entirety. The present application may also be related to U.S. Pat. No. 9,602,063 entitled "Variable Impedance Match and Variable Harmonic Terminations for Different Modes and Frequency Bands", issued Mar. 21, 2017, the disclosure of which is incorporated herein by reference in its entirety. The present application may also be related to U.S. Pat. No. 9,647,631 entitled "Tunable Impedance Matching Network", issued May 9, 2017, the disclosure of which is incorporated herein by reference in its entirety. The present application may also be related to U.S. Pat. No. 9,276,526 entitled "Amplifier with Variable Feedback Impedance", issued Mar. 1, 2016, the disclosure of which is incorporated herein by reference in its entirety. The present application may also be related to Published US Application No. 2015/0236748 A1 entitled "Devices and Methods for Duplexer Loss Reduction", published Aug. 20, 2015, the disclosure of which is incorporated herein by reference in its entirety. The present application may also be related to Published US Application No. 2015/0249479 A1 entitled "RF Switch with Integrated Tuning", published Sep. 3, 2015, the disclosure of which is incorporated herein by reference in its entirety. The present application may also be related to Published US Application No. 2015/0236798 A1, published Aug. 20, 2015, entitled "Methods for Increasing RF Throughput via usage of Tunable Filters", the disclosure of which is incorporated herein by reference in its entirety. The present application may also be related to U.S. Pat. No. 7,795,968, entitled "Power Ranging Transmit RF Power Amplifier", issued on Sep. 14, 2010, the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety.

Cross-Reference to Related Digitally Tunable Elements Applications:

The present application may also be related to U.S. Pat. No. 9,024,700 B2 entitled "Method and Apparatus for use in Digitally Tuning a Capacitor in an Integrated Circuit Device", issued May 5, 2015, the disclosure of which is incorporated herein by reference in its entirety. The present application may also be related to No. U.S. Pat. No. 9,197,194 B2 entitled "Method and Apparatus for Use in Tuning Reactance in an Integrated Circuit Device", issued Nov. 24, 2015, the disclosure of which is incorporated herein by reference in its entirety.

TECHNICAL FIELD

The present application relates to methods and devices for auto-tuning radio frequency (RF) circuits based on frequencies of operation of the circuits that are automatically detected via a clocked frequency detector circuit.

BACKGROUND

Tunable elements of an RF circuit can allow tuning a circuit based on specific frequencies of operation of the circuit which can change, for example, in dependence of a frequency band of operation of the circuit. Such tuning can allow, for example, tuning of RF frontend blocks used in RF communication systems, such as handheld and portable devices, for optimization of their performance over a wide range of frequencies. Tunable circuits used in such RF frontend blocks may include, for example, one or more of power amplifiers (PA's), low noise amplifiers (LNA's), antenna tuners, filters, couplers, mixers and other, as descried, for example, in the above referenced Tunable Circuits Applications, the disclosures of which are incorporated herein by reference in their entirety. Tunable elements of such tunable circuits may include circuits and/or components whose characteristics can be controlled, via either analog or digital control signals. Exemplary tunable elements include digitally tunable capacitors and/or inductors (DTCs, DTLs) as described in the above referenced U.S. Pat. No. 9,024,700 B2 and U.S. Pat. No. 9,197,194 B2, where capacitance and inductance may be controlled via digital control signals (e.g. words). When used in a tunable circuit, DTCs and/or DTLs can change, for example, a frequency response of the circuit based on the provided digital control signals.

In cases where the tunable circuit is monolithically integrated as an integrated circuit (IC), a system integrator using such IC may need to include auxiliary support blocks (firmware/software/hardware) that generate and feed to the IC, frequency based control signals for each tunable element of the IC in order to tune the tunable circuit. In other words, tuning of the tunable circuit may require, for example, detecting and/or establishing a change in an effective operating frequency of the tunable circuit, measuring and/or establishing the effective operating frequency, based on the measured/established frequency, generating control signals for each of the tunable elements of the tunable circuit, and send the generated control signals to the tunable circuit. Such auxiliary support blocks may add to system complexity, integration cost, and physical size, which together, may render usage of such tunable IC less desirable to some system integrators.

SUMMARY

The teachings according to the present disclosure describe devices and methods for on-chip detection of a frequency of operation of a tunable circuit via a clocked frequency detector circuit using a readily available clock signal. In turn, the detected frequency can be used to automatically program digitally tunable elements of the tunable circuit without intervention of, and/or requirement for, auxiliary (external) support blocks. Accordingly, a tunable circuit using the clocked frequency detector according to the present disclosure can be used as a drop-in replacement part to a non-tunable circuit.

According to a first aspect of the present disclosure, a radio frequency (RF) tunable integrated circuit that is configured to operate over a frequency range of operation of an input RF signal is presented, the RF tunable integrated circuit comprising: one or more tunable elements; a clocked frequency detector circuit configured to detect an indication of a frequency of operation, $f_o$, of the input RF signal based on an externally supplied reference clock to the RF tunable integrated circuit; wherein tuning of the one or more tunable elements is based on the detected indication of the frequency of operation of the input RF signal, and is configured to provide a tuned frequency dependent performance of an output RF signal of the tunable integrated circuit.

According to a second aspect of the present disclosure, a method for tuning a radio frequency (RF) tunable circuit is presented, the method comprising: providing a frequency, $f_r$, of a reference clock available on a target system; providing a tunable circuit having one or more tunable elements; providing a frequency range of operation of an input RF signal to the tunable circuit; establishing a number N, N>1, so that for any frequency of operation, $f_o$, within the frequency range of operation, $f_r<<f_o/N$, based on the establishing, providing a divide-by-N circuit that is configured to receive the input RF signal and generate therefrom a divide-by-N signal with a frequency of $f_o/N$ that is substantially higher than the frequency of the reference clock; providing a counter circuit configured to receive the divide-by-N signal and count a number of cycles of the divide-by-N signal in a period of the reference clock; and monolithically integrating the tunable circuit, the divide-by-N circuit, and the counter circuit in a single integrated circuit; wherein during operation of the tunable circuit, tuning of the one or more tunable elements is based on a number of cycles of the divide-by-N signal in the period of the reference clock counted by the counter circuit.

According to a third aspect of the present disclosure, a method for tuning a radio frequency (RF) tunable circuit is presented, the method comprising: providing a frequency, $f_r$, of a reference clock available on a target system; providing a tunable circuit having one or more tunable elements; providing a frequency range of operation of an input RF signal to the tunable circuit; establishing a number N, N>1, so that for any frequency of operation, $f_o$, within the frequency range of operation, $f_r>>f_o/N$, based on the establishing, providing a divide-by-N circuit that is configured to receive the input RF signal and generate therefrom a divide-by-N signal with a frequency of $f_o/N$ that is substantially lower than the frequency of the reference clock; providing a counter circuit configured to receive the divide-by-N signal and count a number of cycles of the reference clock in a defined number of cycles of the divide-by-N signal; and monolithically integrating the tunable circuit, the divide-by-N circuit, and the counter circuit in a single integrated circuit; wherein during operation of the tunable circuit, tuning of the one or more tunable elements is based on a number of cycles of the reference clock in the defined number of cycles of the divide-by-N signal counted by the counter circuit.

The details of one or more embodiments according to the present disclosure are set forth in the accompanying drawings and the description below. Other features, objects, and advantages of such embodiments will be apparent from the description and drawings, and from the claims.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Figure 1:
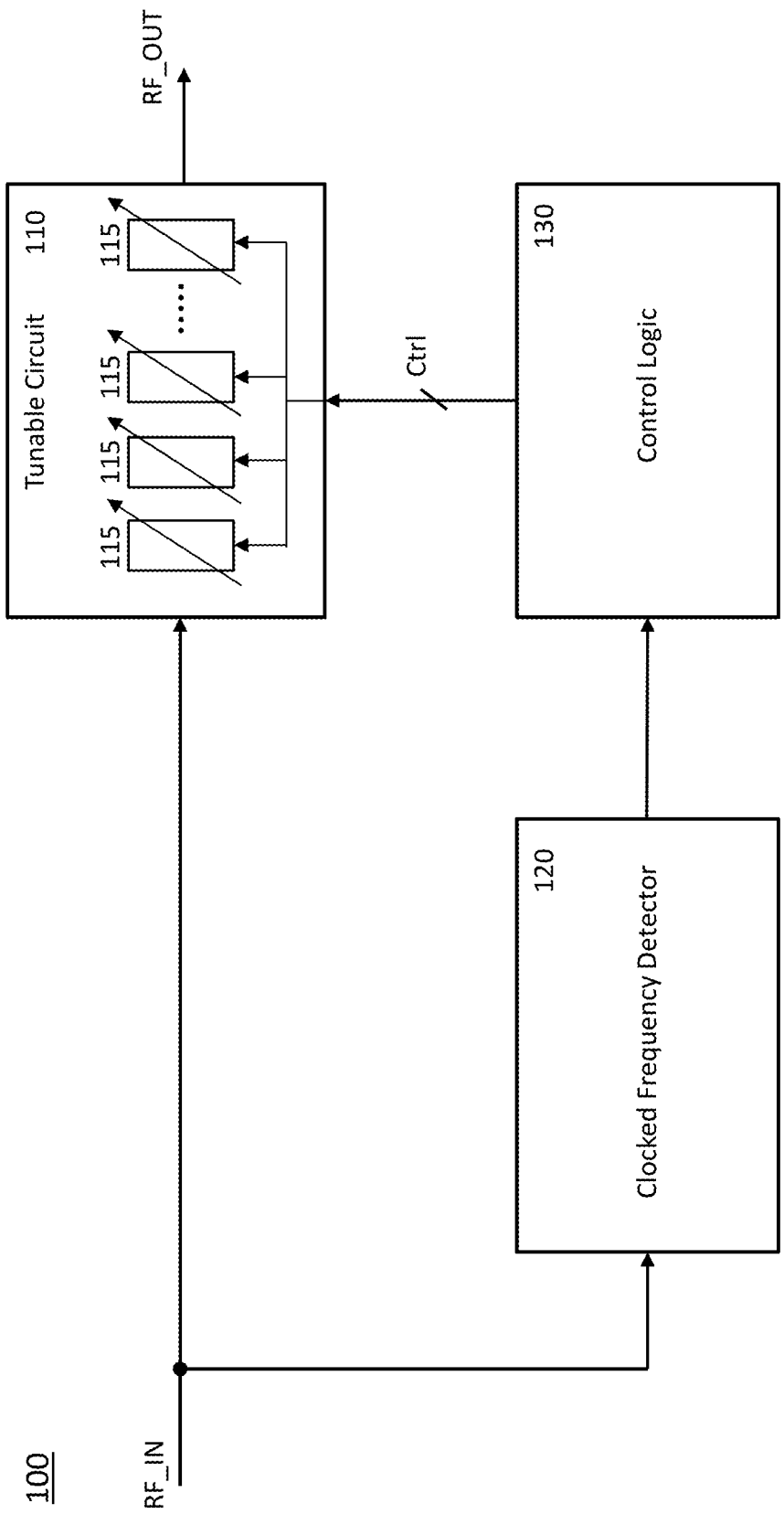
FIG. 1 shows a block diagram of an RF system (100) comprising a tunable circuit (110) whose performance can be tuned based on a frequency of an input RF signal to the tunable circuit via a clocked frequency detector circuit (120) according to various embodiments of the present disclosure. The RF system (100) may be monolithically integrated on a single chip.

FIG. 1 shows a block diagram of an exemplary embodiment according to the present disclosure of a system (100), comprising a tunable circuit (110), a clocked frequency detector circuit (120), and a control logic circuit (130). The system (100) may be monolithically integrated on a single chip.

The tunable circuit (110) of FIG. 1 is configured to receive an input signal, RF_IN, at an input port of the tunable circuit (110), and generate therefrom, an output signal, RF_OUT, at an output port of the tunable circuit (110), by impressing desired characteristics upon the output signal, RF_OUT, that are based on tuned characteristics of digitally tunable elements (115) of the tunable circuit (110). As discussed above, such digitally tunable elements (115) may be digitally tunable capacitors (DTCs) and/or digitally tunable inductors (DTLs) as described, for example, in papers referenced in the above Cross-Reference to Related Digitally Tunable Elements Applications section. In particular, according to some embodiments, reactance of such digitally tunable elements (115) may be controlled via selective coupling and decoupling of reactive unit elements in a main conduction path of the digitally tunable elements via FET switches.

With continued reference to FIG. 1, the clocked frequency detector circuit (120) receives the RF_IN signal, detects a frequency of the RF_IN signal, and provides an indication (e.g. unique identifier) of the detected frequency to the control logic circuit (130). The control logic circuit (130) uses information received from the clocked frequency detector circuit (120) to generate control signals that are provided to the tunable circuit (110) for tuning of the digitally tunable elements (115) of the tunable circuit (110), and thereby, impressing the desired characteristics upon the output signal, RF_OUT. According to some exemplary embodiments, the control logic circuit (130) may use simple logic gates and/or a lookup table to generate the control signals for tuning of the digitally tunable elements (115) of the tunable circuit (110). Such control signals may be digital control signals in the form of bits, bytes, words, or other formats known to a person skilled in the art and as dictated by corresponding control interface of the tunable circuit (110) and/or corresponding digitally tunable elements (115). The control logic circuit (130) can be designed/implemented according to the control interface requirements of the tunable circuit (110) and/or corresponding digitally tunable elements (115), including simple latched data or more intelligent interfaces using proprietary or known in the art bussed architecture. The control logic circuit (130) may also include safety checks and routines that, for example, apply the control signals according to a predetermined order of the digitally tunable elements (115) so as to not damage the tunable circuit (110), and/or limit control signals to a subrange of a possible range of detected frequencies. A person skilled in the art would appreciate that lack of analog circuit in the detection of the frequency of the RF_IN signal as provided by the circuit of FIG. 1, may provide some advantages, such as, for example, amplitude resolution and quantification related errors possible with analog detection circuits.

A person skilled in the art is well aware of known implementation practices that use phase-locked loops (PLL's) to detect a frequency of a signal by (phase) locking to a clock of a known frequency. In such implementations, a reference oscillator (e.g. crystal oscillator) of a known frequency is provided, from which the clock of known frequency is derived, via, for example, counters. In other implementations, frequency detection may be provided by using counters or dividers and without a PLL. For example, one could count or divide on every RF cycle and then use the number of RF cycles per a reference clock cycle to get an indication of the input frequency. There are many ways to use counters and/or dividers for frequency detection applications, referred to in the present disclosure as "clocked" frequency detection, but all involve a reference clock. By virtue of its bulkiness, such reference clock may not be suitable for monolithic integration with the system (100) of FIG. 1, and therefore may be provided as an external auxiliary support block to the system (100). Furthermore, a person skilled in the art is well aware of undesired effects of providing a reference clock, as such reference clock may generate spurious clock components whose frequencies may interact with operating frequencies of the tunable circuit (110). Therefore, a person skilled in the art would appreciate that the clocked frequency detector circuit (120) according to the present disclosure may not use a dedicated (reference) clock to detect a frequency of operation of the RF_IN signal, but rather an existing system clock. Accordingly, the system (100) according to the present disclosure can be monolithically integrated and operate in an autonomous manner, where, for example, tuning can be automatically performed as an internal function of the system (100). A person skilled in the art would realize that the input RF_IN signal must be large enough to drive the clocked frequency detector circuit (120) shown in FIG. 1. In case where the RF_IN signal is not large enough, one or more additional buffer amplifier circuits may be used to amplify the signal, as shown, for example, in FIGS. 5A, 5B and 5C later described. In practice, an RF signal that is part of a transmit path of an RF front end system may generally be a larger RF signal than an RF signal part of a receive path of an RF front end system. However, one may tap the RF signal at any point in the transmit and/or receive paths to detect the frequency. For example, in a receive path, one may tap the RF signal for provision to the clocked frequency detector circuit (120) at a point of the receive path after several stages of gain.

With further reference to FIG. 1, the system (100) may be part of a higher level communication system, such as, for example, a handheld device, tablet, and/or other wireless communication devices. A person skilled in the art is well aware of various inter-chip interface standards proposed for, and used in, such communication systems or other embedded system architectures, such as, for example, the MIPI RFFE interface for mobile device RF front-end architectures proposed by the MIPI (mobile industry processor interface) Alliance, or the more generic serial peripheral interface (SPI). A person skilled in the art is also well aware that such interface standards always comprise a stable reference clock that is used for data interface synchronization and clocking purposes. Accordingly, the clocked frequency detector (120) of the present disclosure may use such existing interface clock as a reference clock for detection of the frequency of the RF_IN signal.

Figure 2A:
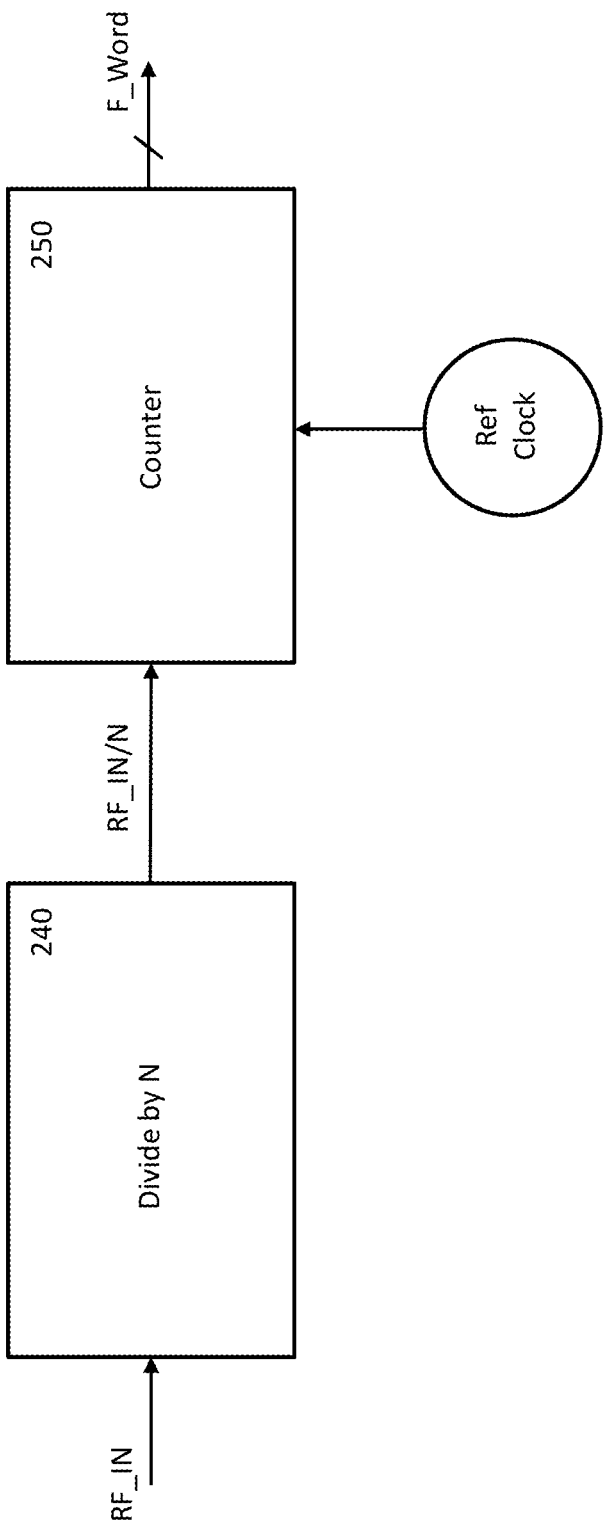
FIG. 2A shows a simplified block diagram of the clocked frequency detector circuit (120) according to the present disclosure, comprising a divide-by-N circuit, a counter circuit, and a reference clock.

FIG. 2A shows a simplified circuit diagram of the clocked frequency detector circuit (120), according to an exemplary embodiment of the present disclosure, where a reference clock, Ref_Clock, part of an existing system interface of a target (communication) system for the system (100) of FIG. 1, is used to measure, or provide an indication of, the frequency of the RF_IN signal. As can be seen in FIG. 2A, the clocked frequency detector circuit (120) comprises a divide-by-N circuit (240), e.g. a counter clocked by the RF_IN signal, and a counter circuit (250) that is clocked by the reference clock, Ref_Clock. It should be noted that the reference clock, Ref_Clock, shown encircled in the figures of the present disclosure, is a signal that is not generated by the system (100) according to the present disclosure, but rather made available to the system (100), and therefore can be considered as an "external" clock signal with respect to the system (100) and a corresponding integrated chip.

With continued reference to FIG. 2A, according to an embodiment of the present disclosure, the divide-by-N circuit (240) may provide a signal, RF_IN/N that has a frequency equal to f/N, where f is the frequency of the RF_IN signal, and N is a number greater than one. This allows to convert a higher frequency signal (RF_IN) to a lower frequency signal (RF_IN/N) that can be measured, via the counter (250), based on the frequency of the readily available reference clock, Ref_Clock. For example, the counter (250) may count number of reference clock, Ref_Clock, cycles in a high state of the RF_IN/IN signal, as depicted in the timing diagram of FIG. 2B. As can be seen in such timing diagram, during a Measuring Period, which can correspond to the high state of the RF_IN/N signal, the counter (250) may be clocked by the reference clock, Ref_Clock, to count, starting from, for example, a counter value equal to zero, the number of cycles of the reference clock, Ref_Clock, within the Measuring Period. At the end of the Measuring Period, the counted number of cycles m by the counter (250) is represented by an output word value of the counter (250), F_Word, which represents (e.g. proportional to) a value of the frequency of the RF_IN signal. Changing the frequency of the RF_IN signal, changes the length of the Measuring Period, and therefore the value of F_Word. A person skilled in the art would realize that there may be other methods to evaluate/determine a frequency of the RF_IN signal based on the basic circuit of FIG. 2A. For example, as shown in the timing diagram of FIG. 2C, the Measurement Period may be set by the reference clock, Ref_Clock, and the counter (250) may count number of cycles (or edges) of the RF_IN/N signal within the Measurement Period. Such implementation may allow for less logic gates than an implementation discussed with respect to FIG. 2B, as a lesser division of the RF_IN signal may be required.

With further reference to FIG. 2A, according to a non-limiting exemplary case, the frequency of the RF_IN signal is f=700 MHz, and N=10000, so the frequency of the RF_IN/N signal is f/N=70 kHz, and therefore the Measuring Period is equal to 1/70 kHz=14.285 µs. The reference clock, Ref_Clock, increments the counter (250) during the Measuring Period, which starts at a rising edge of RF_IN/N and ends at a next falling edge of RF_IN/N. If the reference clock, Ref_Clock, is of frequency $f_{ref\_clock}$ and the counter (250) counts up to m during the Measurement Period, then then the measured period of RF_IN/N is $m*(1/f_{ref\_clock})$, and the measured frequency of RF_IN/N is $f_{ref\_clock}/M$. Therefore, the measured frequency of the RF_IN signal is equal to $N*(f_{ref\_clock}/m)$. Assuming that the frequency of the reference clock, Ref_Clock, is 10 MHz, and f=700 MHz, then during the Measurement Period (14.285 µs) the counter (250) counts m=142 edges of the reference clock, Ref_Clock. This gives a value of the period of RF_IN/N that is approximately 142*0.1 µs=14.2 µs, so the measured frequency of the RF_IN signal is $N*(f_{ref\_clock}/m)=10000*(10$ MHz/142)=704 MHz. A person skilled in the art would realize that adjusting the value of the factor N can result in greater or lesser accuracy of the measurement depending on the adjusted value of N.

With further reference to FIG. 2A, a person skilled in the art would realize that depending on the frequency of the readily available reference clock, Ref_Clock, and a frequency, or frequencies, of operation of the RF_IN signal, the value N of the divide-by-N circuit (240) may be changed. Such change may be performed prior to shipment of the system (100) to a system integrator, in view of known/expected values of the readily available reference clock, Ref_Clock, and the frequency, or frequencies, of operation of the RF_IN signal in a target communication system.

Figure 2B:
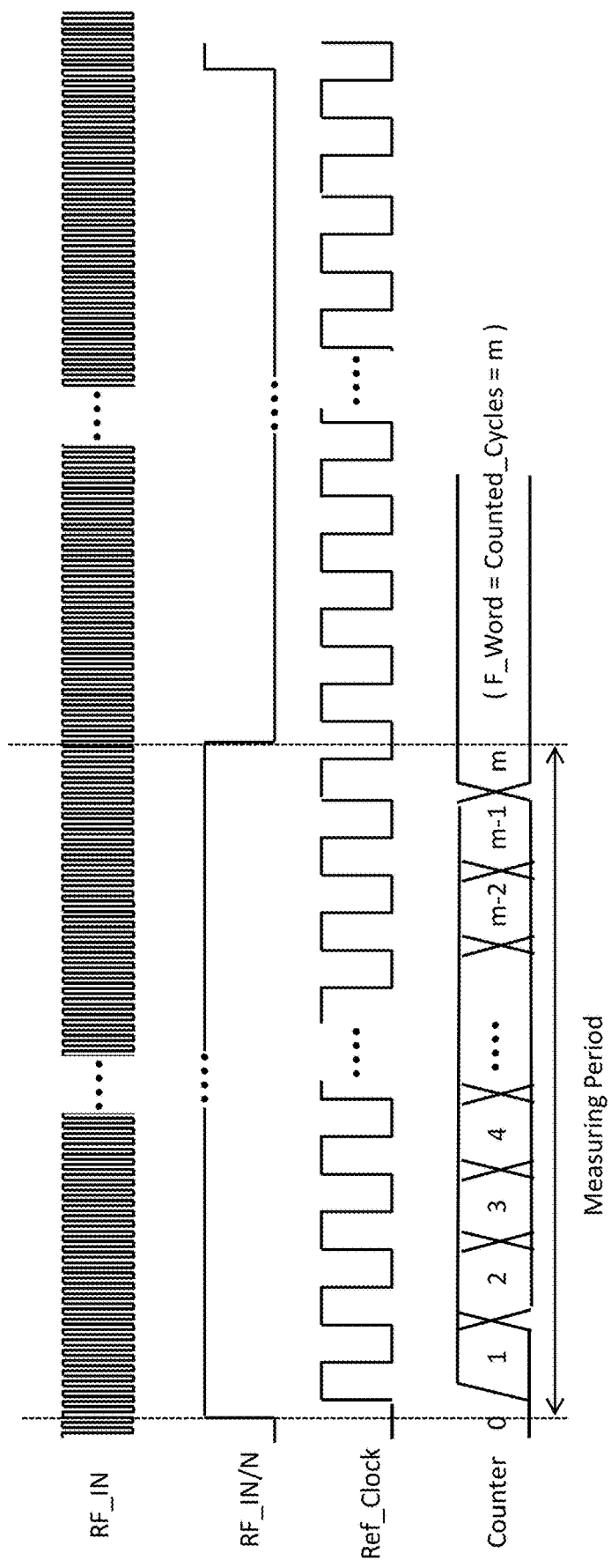
FIG. 2B shows a timing diagram representative of a frequency measurement of the clocked frequency detector circuit (120) of FIG. 2A based on a counting over a measuring period.
Figure 2C:
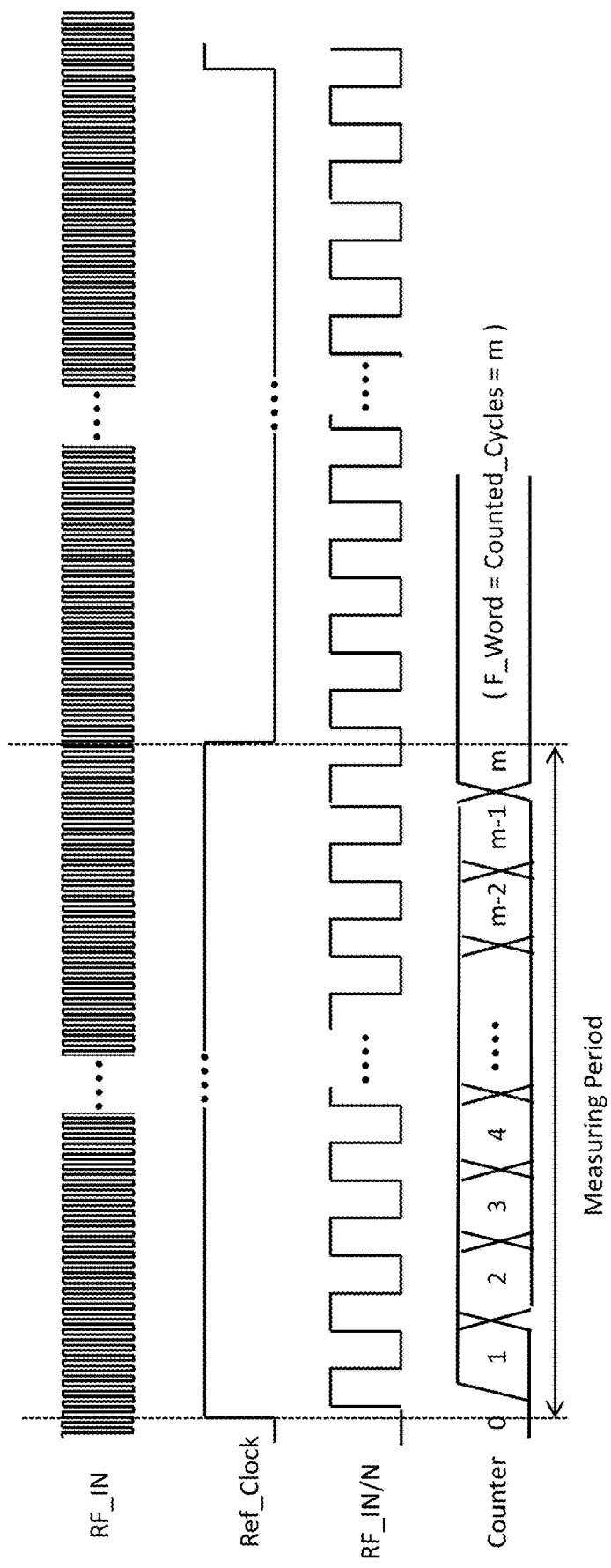
FIG. 2C shows a timing diagram representative of a frequency measurement of the clocked frequency detector circuit (120) of FIG. 2A based on a counting over a plurality of measuring periods.

With further reference to FIG. 2A, FIG. 2B and FIG. 2C, it should be noted that a frequency detection resolution of the clocked frequency detector circuit (120) may be based on parameters that include the frequency of the RF_IN signal, the value of N, and the frequency of the reference clock, Ref_Clock, of which only the value N can effectively be used by the clocked frequency detector circuit (120) to control detection resolution, as the other two parameters are given. It follows that according to an embodiment of the present disclosure, the value N of the divide-by-N circuit (240) may be selected based on the frequency of the readily available reference clock, Ref_Clock, and a frequency, or frequencies, of operation of the RF_IN signal. According to a further embodiment of the present disclosure, such selection may be performed prior to shipment of the system (100) to a system integrator, in view of known/expected values of the readily available reference clock, Ref_Clock, and the frequency, or frequencies, of operation of the RF_IN signal in a target communication system.

A person skilled in the art would also realize that a higher frequency detection resolution of the clocked frequency detector (120) may in turn allow for an increase in number of tuned states of the tunable circuit (110) of FIG. 1. Such frequency detection resolution of the clocked frequency detector circuit (120) of FIG. 2A may be based on desired tuning performance of the tunable circuit (110). For example, in one case, tuning may be solely based on a frequency band of operation of the tunable circuit (110), and in another case, tuning may be further based on a deviation of a frequency of operation within a given frequency band of operation, and therefore may require a higher frequency detection resolution. As discussed above, such higher frequency detection resolution may be provided by, for example, a larger value N of the divide-by-N circuit (240), and/or a counting of the number of cycles of the reference clock, Ref_Clock, over a plurality of measuring periods as shown in FIG. 2C.

Figure 3A:
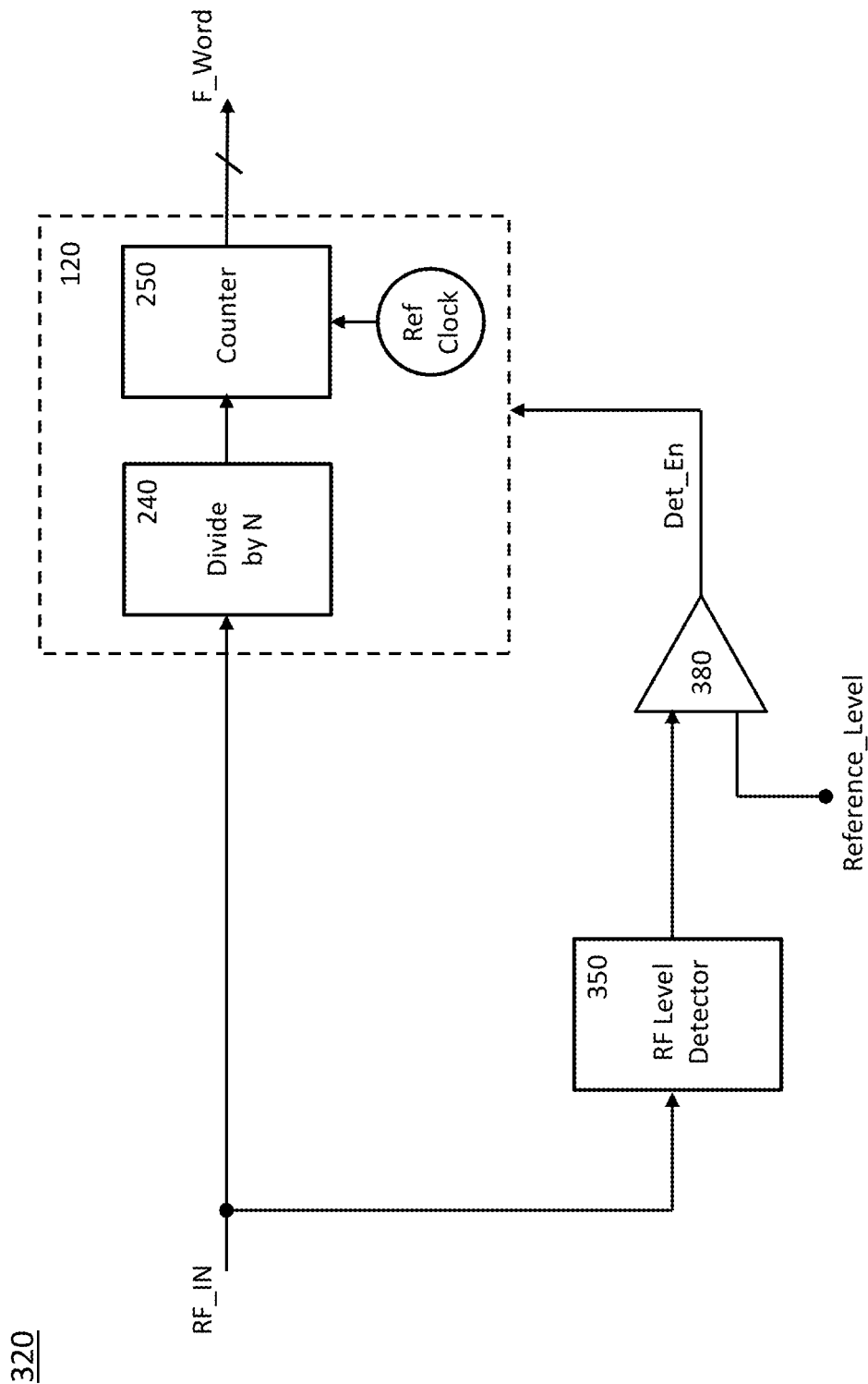
FIG. 3A shows a simplified block diagram of a clocked frequency detector, according to an embodiment of the present disclosure, based on the embodiment depicted in FIG. 2. In the embodiment depicted in FIG. 3A, an additional RF level detector coupled to a comparator is used to verify an amplitude level of the input RF signal prior to enabling frequency detection via the clocked frequency detector.

FIG. 3A shows further implementation details of the clocked frequency detector according to the present disclosure, where frequency detection may be triggered based on adetected amplitude of the RF_IN signal. As can be seen in FIG. 3A, and additional RF level detector circuit (350), coupled to the input RF_IN signal, may be used to detect an amplitude level of the input RF_IN signal which subsequently may be compared, via comparator (380), to a reference amplitude level. If the amplitude level detected via the additional RF level detector circuit (350) is larger than the reference amplitude level, then the comparator (380) outputs an enabling signal, Det_En, that triggers (e.g. via either edge or level) operation of the clocked frequency detection circuit (e.g. 120) as described above. A person skilled in the art would know of many exemplary designs for implementation of the RF level detector circuit (350), such as, for example, the rectifier based circuit depicted in FIG. 3B.

Figure 3B:
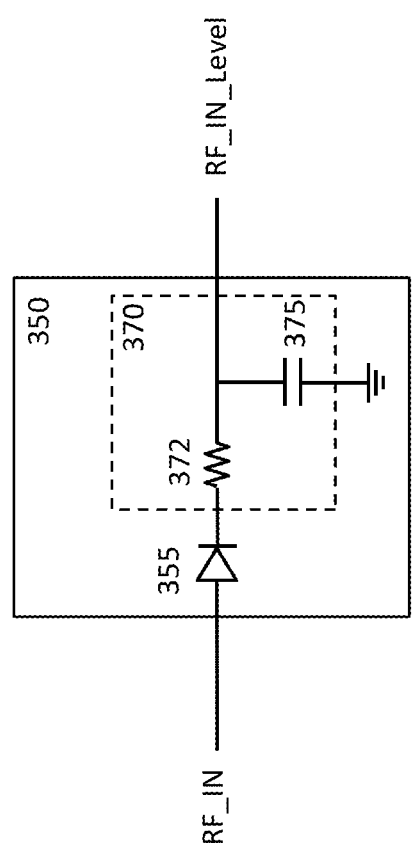
FIG. 3B shows an exemplary circuital implementation of the RF level detector of FIG. 3A.

The exemplary rectifier based RF level detector circuit (350) of FIG. 3B comprises a diode (355) coupled to a low pass filter (370). According to an exemplary embodiment, the low pass filter may be a simple single pole filter comprising a series resistor (372) and a shunted capacitor (375). The diode (355) may perform the RF level detection of the RF_IN signal, and the filter (370) may remove frequency components of a detected RF level associated with, for example, amplitude modulation components of the RF_IN signal. According to an exemplary embodiment of the present disclosure, components (372, 375) of the low pass filter (370) may provide a corner frequency of the filter (370) that is lower than the frequencies of the amplitude modulation components of the RF_IN signal. Accordingly, the RF level detector circuit of FIG. 3B can allow for a more consistent triggering, via the enabling signal, Det_En, of the clocked frequency detector circuit (120) based on a level of the RF_IN signal.

With further reference to FIG. 3A, the additional RF level detector circuit (350) may be used to ensure that the amplitude level of the RF_IN signal is at a known level when frequency detection is performed via circuit (120). It should be noted that the divide-by-N circuit (240) may operate based on zero crossings of the RF_IN signal and therefore may be desensitized with respect to variation of the input power level (e.g. amplitude). It follows that the clocked frequency detection according to the present teachings may not require a constant input power level (i.e. amplitude level of the RF_IN signal) to the detection circuit (120) for detection of the frequency of the RF_IN signal. However, according to some preferred embodiments, it may be desirable to perform the frequency detection according to an input power level of the RF_IN signal. For example, the reference amplitude level provided to the comparator (380) may be set so that the Det_En signal is enabled when the input power level, Pin, of the RF_IN signal is at Pin=0 dBm. In another case where, for example, the tunable circuit (110) may comprise an RF PA, the input power may be enabled (e.g. via a transceiver unit) at some point, in preparation of a transmission, and may have a finite ramp time where the input power ramps before it achieves a final input power level, Pin_final, as shown, for example in FIG. 6 later described. In this case, the reference amplitude level provided to the comparator (380) may be set so that the Det_En signal is enabled when the input power level, Pin, is such that Pin<Pin_final. A person skilled in the art would know of many possible implementations of input power level based triggering circuits that may be used to similarly provide a triggering signal to start the clocked frequency detection circuit (120) according to the present teachings, and therefore, the exemplary implementations described with respect to FIG. 3A should not be considered as limiting such teachings.

As discussed above with reference to FIG. 2C, in response to a change of frequency of the RF_IN signal, a higher frequency detection resolution of the clocked frequency detection circuit (e.g. 120) may be provided by counting of the number of cycles of the reference clock, Ref_Clock, over a plurality of the Measuring Periods. According to an exemplary embodiment of the present disclosure, such higher frequency detection resolution of the clocked frequency detector circuit (120), may be provided via a timer circuit that may be used to allow the frequency detection (counting of the number of cycles) to last a predetermined amount of time that spans over the plurality of Measuring Periods. If desired, such timer may be triggered after detection of a suitable input level of the RF_IN signal (per FIG. 3A), in which case a value of the output word F_Word of the counter (250) representing the frequency of the RF_IN signal is made available at the output of the clockless frequency detection circuit (120) after expiration of the timer. Such suitable input level may be determined based on an a priori knowledge of a system that generates the RF_IN signal. Such timer circuit (490) is shown in FIG. 4.

Figure 4:
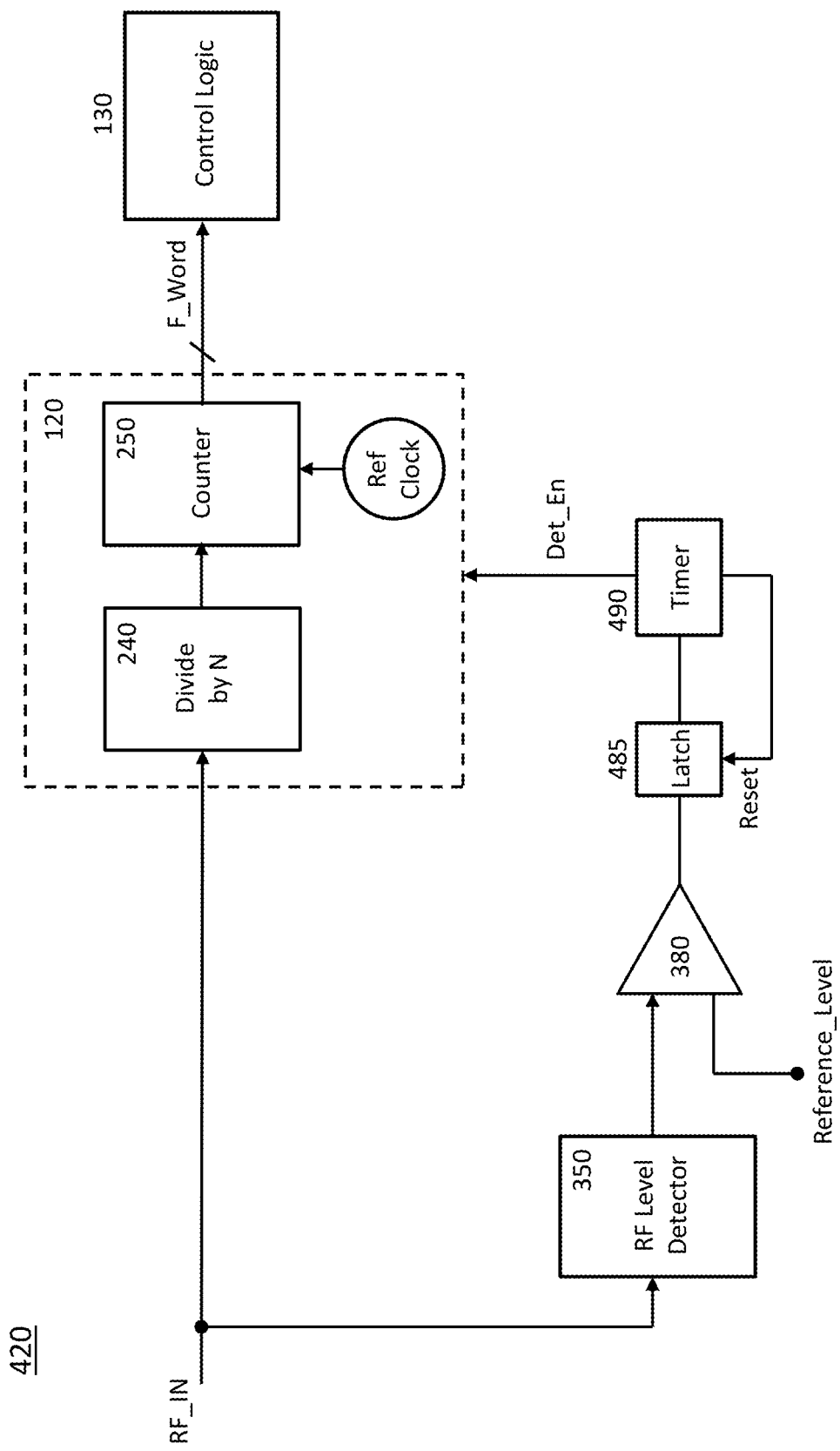
FIG. 4 shows a simplified block diagram of a clocked frequency detector, according to an embodiment of the present disclosure, based on the embodiment depicted in FIG. 3. In the embodiment depicted in FIG. 4, a timer and a latch circuit are used to further qualify an enabling signal that when active, enables frequency detection via the clocked frequency detector.

FIG. 4 shows a clocked frequency detection circuit (420), which is based on the circuit (320) of FIG. 3A, where instead of having the comparator (380) directly control the enabling of the frequency detector circuit (120), the comparator (380) may drive a latch (485), and the latch in turn may enable a timer (490). Once enabled, the timer output, Det_En, may change state and thereby enable the frequency detector circuit (120) for a specific amount of time during which such state is maintained. The timer (490) may be programmed to elapse at a time long enough to span over a plurality of the Measuring Periods shown in FIG. 2C, so to allow for a consistent and higher frequency detection resolution. As shown in FIG. 4, when the timer (490) elapses, the latch (485) may be reset via a Reset signal sent by the timer circuit (490), which puts the latch (485) in a ready condition for a next measurement. The F_Word output by the counter (250) may in turn be used to drive the control logic circuit (130) which translates the detected frequency (e.g. indication thereof) into appropriate control words for tuning of the tunable elements (115) of the tunable circuit (110) shown in FIG. 1. Such translation may be performed according to a variety of implementations known to a person skilled in the art, such as, for example, simple logic gates and/or one or more lookup tables. According to some embodiments of the present disclosure, the F_Word may be latched upon expiration of the timer to provide an appropriate indication of a detected frequency of the RF_IN signal to be considered by the control logic circuit (130). According to a further embodiment of the present disclosure, the timer circuit (490) may operate based on the same reference clock, Ref_Clock (not shown in the figures). That is, the timer (490) counts cycles of the reference clock, Ref_Clock, till a predetermined absolute time has elapsed. Finally, is should be noted that presence of the timer (490) should not be considered as limiting the scope of the present invention, as lengthening of a time period upon which cycles of the reference clock, Ref_Clock, are counted, may also be obtained by a higher value of N used in the divide-by-N circuit (240).

Figure 5A:
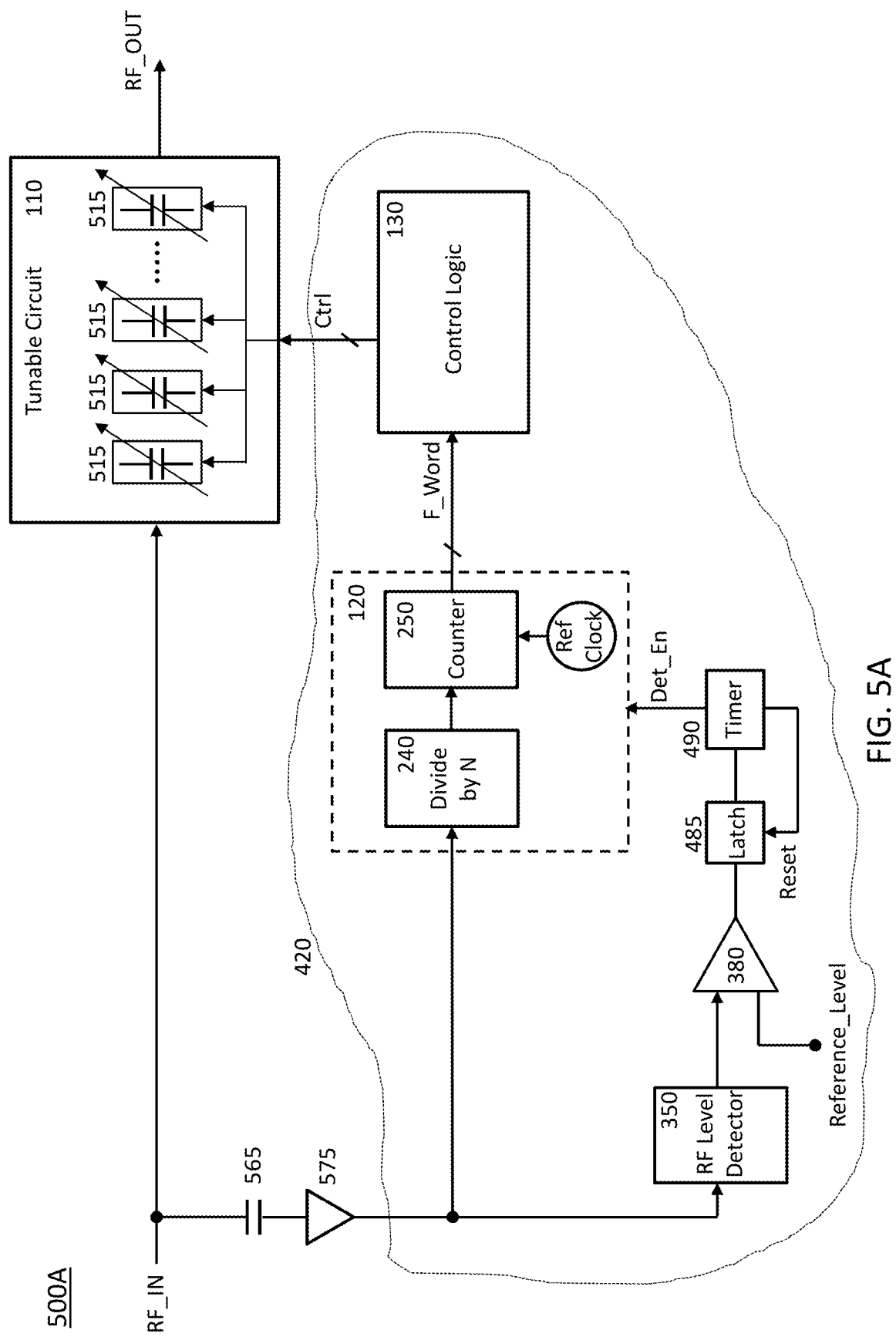
FIG. 5A shows a block diagram of an exemplary implementation of the RF system (100) of FIG. 1 using the clocked frequency detector of FIG. 4, wherein the tunable circuit (110) comprises digitally tunable capacitors.

FIG. 5A shows a block diagram of an exemplary implementation of the RF system (100) of FIG. 1 using the clocked frequency detector (420) of FIG. 4, wherein the exemplary tunable circuit (110) comprises digitally tunable capacitors (515). Furthermore, a coupling capacitor (565) may be used to remove a DC component of the RF_IN signal fed to the clocked frequency detector (420), so to allow, for example, operation of the divide-by-N circuit (240) based on zero crossings of an AC component of the RF_IN signal. Also, a buffer circuit (575) may be used to reduce any loading effect of the RF_IN signal fed to the tunable circuit (110) due to a coupling to the clocked frequency detector circuit (420).

Figure 5B:
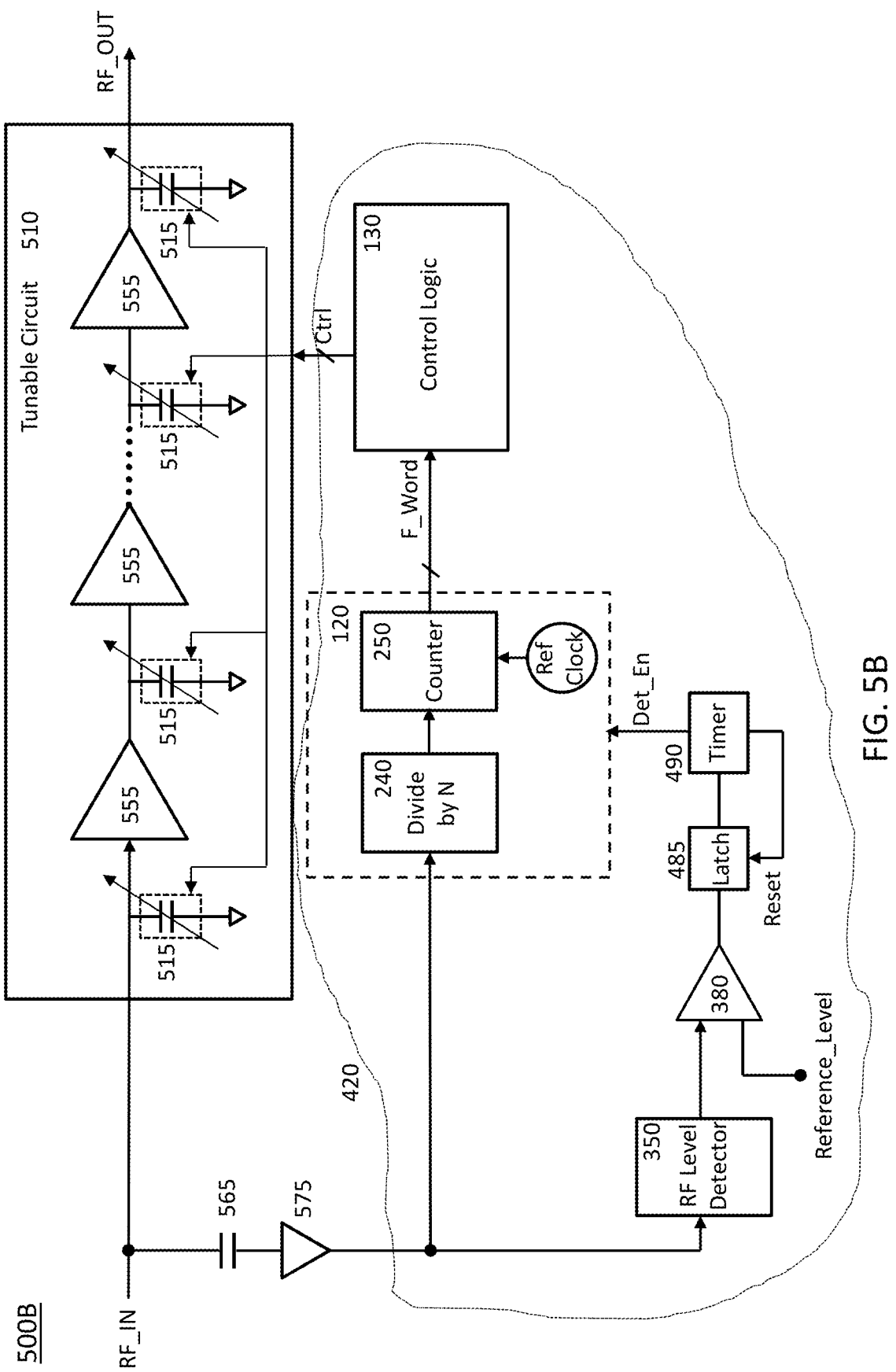
FIG. 5B shows a block diagram of an exemplary implementation of the RF system of FIG. 5A wherein the tunable circuit comprises one or more RF amplifiers coupled to the one or more digitally tunable capacitors (DTCs) used for tuning of the tunable circuit.

FIG. 5B shows a block diagram of an exemplary implementation of the RF system of FIG. 5A wherein the tunable circuit (510) comprises one or more RF amplifiers (555) coupled to digitally tunable elements (515) comprising one or more digitally tunable capacitors (DTCs) used for tuning of the tunable circuit (510). A person skilled in the art would understand that other tunable elements (515) for tuning of other analog circuits different from the amplifiers (555) shown in FIG. 5B may be present in the tunable circuit (510).

Figure 5C:
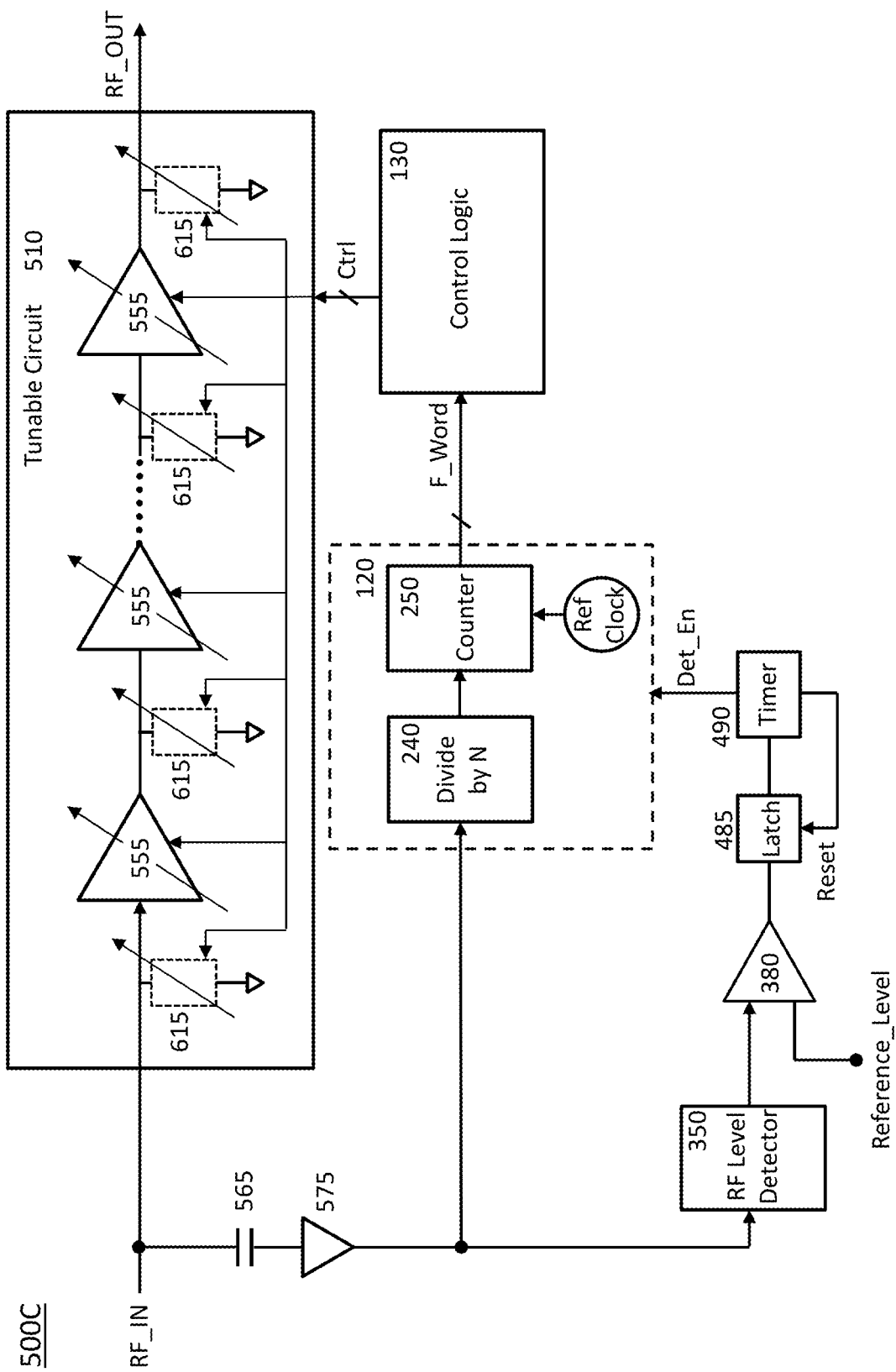
FIG. 5C shows a block diagram of an exemplary implementation of the RF system of FIG. 5A wherein the tunable circuit comprises one or more tunable RF amplifiers coupled to the one or more digitally tunable networks (e.g., tunable matching) used for tuning of the tunable circuit.

FIG. 5C shows a block diagram of an exemplary implementation of the RF system of FIG. 5A wherein the tunable circuit (510) comprises one or more tunable RF amplifiers (555) coupled to digitally tunable networks (615), where the digital tunable elements can be, for example, tunable matching networks comprising, for example, one or more digitally tunable capacitors (DTCs) and/or inductors (DTLs), and the tunable RF amplifiers, can be, for example, scalable periphery amplifiers. A person skilled in the art would understand the benefits provided by such tunable matching networks (615) and tunable RF amplifiers (555), where further detailed description can be found, for example, in the above referenced Tunable Circuits Applications, whose disclosures are incorporated herein by reference in their entirety.

It should be noted that tuning according to the present disclosure may be performed by way of control words that when applied to an input control terminal of a digitally tunable element (115, 515) may cause a corresponding change in an operating characteristic of the digitally tunable element (115, 515), thereby providing a tuned frequency dependent performance of the tunable circuit (110). A change in the operating characteristic of any one of the digitally tunable elements (115, 515) may affect any one of measurable performances of the output RF_OUT signal, such as, for example, gain/attenuation, compression point, noise figure, error vector magnitude (EVM), adjacent channel leakage ration (ACLR), etc. Some example of such tuning may be found in the above referenced U.S. Pat. Nos. 9,024,700 and 9,197,194, the disclosure of which are incorporated herein by reference in their entirety, which respectively describe digitally controllable tunable capacitors and inductors. As known to a person skilled in the art, and described in several of the above references under the above section "cross-reference to related tunable circuits applications", biasing of an amplifier (e.g. power amplifier) may be controlled via a programmable bias circuit that is configured to programmatically and in view of operating conditions of the amplifier, adjust biasing voltages and/or currents to the amplifier. According to an exemplary case, biasing of the amplifier (e.g. power amplifier) may be advantageously controlled in dependence of a frequency, or a frequency range, of an input RF signal to the amplifier, where an adjustable (e.g., programmable) voltage and/or current generator may set according to the detected frequency to provide a desired bias voltage and/or current to the amplifier. A person skilled in the art would know of many different implementations of an adjustable current generator, including the non-limiting case of using programmable current mirrors and programmable DC/DC converters. Likewise, a person skilled in the art would know of many different implementations of a programmable voltage generator, including the non-limiting case of an adjustable (programmable) resistive voltage divider.

Tuning according to the present disclosure may also be performed by way of one or more switches that can affect a conduction path of an RF signal through the tunable circuit (110, 510), as described for example, in the above referenced U.S. Pat. No. 9,602,063 whose disclosure is incorporated herein by reference in its entirety. In this case, under control of the digital output word, F_Word of the clocked frequency detector circuit (120, 320, 420) as translated by the control logic circuit (130), the one or more switches can be turned ON/OFF to route the RF signal through a sequence of specific conduction paths to provide a desired effect to the conducted RF signal through the tunable circuit (110, 510). Also, as described in U.S. Pat. No. 9,602,063, the one or more switches may be used to switch IN/OUT elements (e.g. harmonic shorts/open, capacitive, inductive, resistive elements, etc.) within the conduction path of the tunable circuit (110, 510). Other embodiments where switches are used to tune a circuit are described in the above referenced papers whose disclosures are incorporated herein by reference in their entirety. For example, U.S. Pat. No. 9,294,056 uses switches to control biasing and/or output power (e.g. size, scale) of tunable amplifiers, which may be based on a frequency of a corresponding input RF signal.

Figure 6:
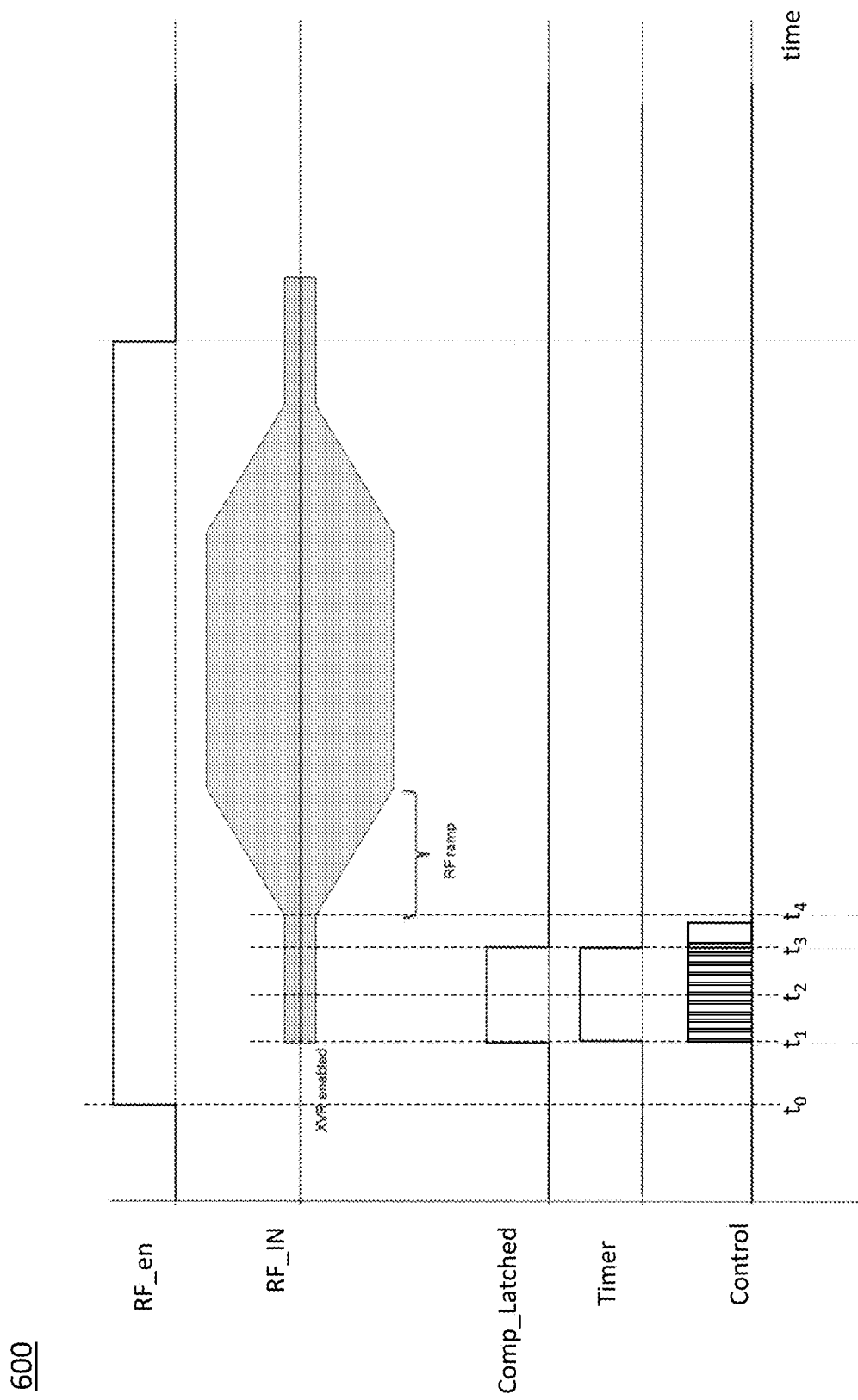
FIG. 6 shows an exemplary timing diagram of the system (100) depicted in FIG. 1, where the clocked frequency detector (120) is provided by the exemplary configuration (420) of FIG. 4.

FIG. 6 shows an exemplary timing diagram of the system (100, 500A, 500B) depicted in FIGS. 1, 5A, 5B, where frequency detection is provided by the exemplary configuration (420) of FIG. 4. Here, it is assumed that the tunable circuit (110) is an RF frontend system that includes, for example, a tunable power amplifier and other related tunable circuits that may be used in such frontend system, including, but not limited to, tunable matching circuits, tunable filters, tunable couplers, tunable mixers, tunable biasing circuits, tunable LNA's, and other, as described, for example, in the above referenced Tunable Circuits, the disclosures of which are incorporated herein by reference in their entirety. In turn, such tunable circuits may be tuned via combination of digitally tunable elements (115, 515) such as, DTCs and/or DTLs, DACs, digitally tunable resistors and other digitally tunable elements known to a person skilled in the art, and as described, for example, in the above referenced Tunable Elements, the disclosures of which are incorporated herein by reference in their entirety.

With continued reference to the timing diagram of FIG. 6, at a time t0, an enabling signal, RF_en, is generated by a system controller (e.g. transceiver XVR, not shown) that indicates a beginning cycle of an active communication (e.g. transmission/reception of an RF signal). An RF signal to be transmitted, for example, is generated at time t1, which may have a constant RF amplitude between the time t1 and a time t4, as depicted in FIG. 6. Such behavior is assumed known to the system (100, 500A, 500B) which receives the RF signal at time t1 as its RF_IN, and accordingly sets the reference level to the comparator (380), as the system (100, 500A, 500B) uses the frequency detection circuit of FIG. 4. The comparator (380) having a reference level smaller than the constant RF amplitude of the incoming RF signal, detects presence of the RF signal and changes state of its output, which is latched by the latch (485), which in turn triggers a start cycle of the timer (490), where the cycle is programmed to be sufficiently long (e.g. >t2−t1) so to provide a desired frequency detection resolution of the clocked frequency detector (420). The cycle of the timer (490) elapses at time t3, at which time the clocked frequency counter (120) stops counting and a counted number of cycles of the Ref_Clk is provided by the value of the output word, F_Word, of the clocked frequency counter (120). In turn, the F_Word is provided to the logic circuit (130) for generation of corresponding control words (Ctrl) to the tunable circuit (110, 510), and thereby to the tunable elements (115, 515) of the tunable circuit (110, 510). At the same time t3, the latched comparator output is reset in preparation to a next active communication cycle. As can be seen in FIG. 6, the initial constant portion of the RF amplitude signal lasts from the time t1 to a time t4, after which the RF amplitude ramps up to a desired level. As noted above, such system behavior is a priori known to the system (100, 500A, 500B), and a corresponding programming of the system (100, 500A, 500B) is performed beforehand (e.g. factory, system integrator, etc.), which may include, for example, setting of the reference voltage to the comparator (380), length of the timer (490) cycle, etc.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MES-FET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A radio frequency (RF) tunable integrated circuit configured to operate over a frequency range of operation of an input RF signal, comprising:
   one or more tunable elements; and
   a clocked frequency detector circuit configured to detect an indication of a frequency of operation, $f_o$, of the input RF signal based on an externally supplied reference clock to the RF tunable integrated circuit,
   wherein tuning of the one or more tunable elements is based on the detected indication of the frequency of operation of the input RF signal, and is configured to provide a tuned frequency dependent performance of an output RF signal of the tunable integrated circuit, and
   wherein the reference clock is a clock used in an interface protocol that comprises one of: a) mobile industry processor interface (MIPI), and b) serial peripheral interface (SPI).

2. The radio frequency (RF) tunable integrated circuit according to claim 1, wherein the clocked frequency detector circuit comprises:
   a divide-by-N circuit configured to receive the input RF signal and generate therefrom a divide-by-N signal with a frequency of $f_o/N$ that is higher than a frequency of the reference clock, N being a number substantially greater than one; and
   a counter circuit configured to receive the divide-by-N signal and count a number of cycles of the divide-by-N signal in a period of the reference clock.

3. The radio frequency (RF) tunable integrated circuit according to claim 2, further comprising an enabling circuit comprising a level detector, the enabling circuit configured to provide an enabling signal to the clocked frequency detector circuit to enable detection of the indication of the frequency of operation when the enabling signal is active, the enabling signal based on a detected level of the input RF signal by the level detector.

4. The radio frequency (RF) tunable integrated circuit according to claim 3, wherein the enabling circuit is configured to set and maintain the enabling signal active during a time where the input RF signal has a constant amplitude.

5. The radio frequency (RF) tunable integrated circuit according to claim 4, wherein the enabling circuit further comprises a comparator configured to compare the detected level of the input RF signal by the level detector to a reference amplitude that is smaller than the constant amplitude of the input RF signal, and output the enabling signal based on the comparison.

6. The radio frequency (RF) tunable integrated circuit according to claim 5, wherein the enabling circuit further comprises a latch circuit coupled to an output of the comparator.

7. The radio frequency (RF) tunable integrated circuit according to claim 6, wherein the enabling circuit further comprises a timer circuit coupled to an output of the latch circuit, the timer circuit configured to activate the enabling signal and maintain the enabling circuit activated during a portion of the period of the reference clock.

8. The radio frequency (RF) tunable integrated circuit according to claim 7, wherein the timer circuit counts a number of cycles of the reference clock.

9. The radio frequency (RF) tunable integrated circuit according to claim 2, further comprising a logic circuit configured to generate control words for tuning of the one or more tunable elements based on an output word of the counter circuit in correspondence of a counted number of cycles of the divide-by-N signal in the period of the reference clock.

10. The radio frequency (RF) tunable integrated circuit according to claim 9, wherein the logic circuit comprises one or more of: a) a lookup table, and b) logic gates.

11. A radio frequency (RF) device configured to transmit and receive RF signals according to a plurality of frequency bands, the device comprising at least one of:
a) a configurable transmit path coupled to an antenna and configured to transmit RF signals according to the plurality of frequency bands, the configurable transmit path comprising the radio frequency (RF) tunable integrated circuit according to claim 1 that is configured to operate as a tunable power amplifier; and
b) a configurable receive path coupled to the antenna and configured to receive RF signals according to the plurality of frequency bands, the configurable receive path comprising the radio frequency (RF) tunable integrated circuit according to claim 1 that is configured to operate as a low noise amplifier.

12. The radio frequency (RF) tunable integrated circuit according to claim 1, wherein the RF tunable integrated circuit comprises one or more of: a) a tunable RF amplifier, b) a tunable RF power amplifier, c) a tunable low noise amplifier, d) a tunable filter, e) a tunable match circuit, f) a tunable mixer, and g) an antenna tuner.

13. The radio frequency (RF) tunable integrated circuit according to claim 1, wherein a tunable element of the one or more tunable elements comprises a tunable conduction path comprising one or more conduction path segments selected via one or more switches.

14. The radio frequency (RF) tunable integrated circuit according to claim 1, wherein a tunable element of the one or more tunable elements comprises one or more switchable elements configured to be selectively switched in and out a conduction path of the tunable element.

15. The radio frequency (RF) tunable integrated circuit according to claim 1, wherein the RF tunable integrated circuit is monolithically integrated.

16. The radio frequency (RF) tunable integrated circuit according to claim 1, wherein the RF tunable circuit is part of a frontend system of an RF communication system, and wherein the reference clock is the clock used in the interface protocol used for communication to/from devices of the frontend system.

17. The radio frequency (RF) tunable integrated circuit according to claim 1, wherein the tuned frequency dependent performance of the output RF signal comprises one or more of: a) a tuned gain, b) a tuned attenuation, c) a tuned compression point, d) a tuned noise figure, e) a tuned error vector magnitude (EVM), and f) a tuned adjacent channel leakage ration (ACLR).

18. The radio frequency (RF) tunable integrated circuit according to claim 1, wherein the one or more tunable elements comprise one or more of: a) a tunable or programmable reactive element, b) a tunable or programmable capacitor, c) a tunable or programmable inductor, d) a programmable bias circuit, e) a programmable DC/DC converter.

19. The radio frequency (RF) tunable integrated circuit according to claim 1, wherein the clocked frequency detector circuit comprises:
a divide-by-N circuit configured to receive the input RF signal and generate therefrom a divide-by-N signal with a frequency of $f_o/N$ that is lower than a frequency of the reference clock, N being a number substantially greater than one; and
a counter circuit configured to receive the divide-by-N signal and count a number of cycles of the reference clock in a defined number of cycles of the divide by N signal.

20. A method for tuning a radio frequency (RF) tunable circuit, the method comprising:
providing a frequency, $f_r$, of a reference clock available on a target system;
providing a tunable circuit having one or more tunable elements;
providing a frequency range of operation of an input RF signal to the tunable circuit;
establishing a number N, N>1, so that for any frequency of operation, $f_o$, within the frequency range of operation, $f_r \gg f_o/N$;
based on the establishing, providing a divide-by-N circuit that is configured to receive the input RF signal and generate therefrom a divide-by-N signal with a frequency of $f_o/N$ that is substantially lower than the frequency of the reference clock;
providing a counter circuit configured to receive the divide-by-N signal and count a number of cycles of the reference clock in a defined number of cycles of the divide-by-N signal; and
monolithically integrating the tunable circuit, the divide-by-N circuit, and the counter circuit in a single integrated circuit,
wherein during operation of the tunable circuit, tuning of the one or more tunable elements is based on a number of cycles of the reference clock in the defined number of cycles of the divide-by-N signal counted by the counter circuit, and
wherein the reference clock is a clock used in an interface protocol that comprises one of: a) mobile industry processor interface (MIPI), and b) serial peripheral interface (SPI).

21. A method for tuning a radio frequency (RF) tunable circuit, the method comprising:
providing a frequency, $f_r$, of a reference clock available on a target system;
providing a tunable circuit having one or more tunable elements;
providing a frequency range of operation of an input RF signal to the tunable circuit;
establishing a number N, N>1, so that for any frequency of operation, $f_o$, within the frequency range of operation, $f_r \ll f_o/N$;
based on the establishing, providing a divide-by-N circuit that is configured to receive the input RF signal and generate therefrom a divide-by-N signal with a frequency of $f_o/N$ that is substantially higher than the frequency of the reference clock;

providing a counter circuit configured to receive the divide-by-N signal and count a number of cycles of the divide-by-N signal in a period of the reference clock, and monolithically integrating the tunable circuit, the divide-by-N circuit, and the counter circuit in a single integrated circuit;

wherein during operation of the tunable circuit, tuning of the one or more tunable elements is based on a number of cycles of the divide-by-N signal in the period of the reference clock counted by the counter circuit, and wherein the reference clock is a clock used in an interface protocol of the target system that comprises one of: a) mobile industry processor interface (MIPI), and b) serial peripheral interface (SPI).

22. The method according to claim 21, further comprising:

based on the monolithically integrating, assembling the tunable circuit in the target system; and based on the assembling, autonomously tuning an RF performance of the tunable circuit with respect to a change in a frequency of operation of the input RF signal to the tunable circuit.

* * * * *